United States Patent
Egashira

(10) Patent No.: US 8,107,051 B2
(45) Date of Patent: Jan. 31, 2012

(54) EXPOSURE APPARATUS WITH IMPROVED ALIGNMENT MARK POSITION MEASUREMENT CONDITION SETTING FEATURE, AND DEVICE MANUFACTURING METHOD USING THE SAME

(75) Inventor: Shinichi Egashira, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 464 days.

(21) Appl. No.: 11/949,264

(22) Filed: Dec. 3, 2007

(65) Prior Publication Data

US 2008/0129972 A1  Jun. 5, 2008

(30) Foreign Application Priority Data

Dec. 4, 2006 (JP) ................................ 2006-327637
Nov. 27, 2007 (JP) ................................ 2007-306313

(51) Int. Cl.
G03B 27/68 (2006.01)
G03B 27/42 (2006.01)
(52) U.S. Cl. .......................................... 355/52; 355/53
(58) Field of Classification Search .................... 355/53, 355/52; 356/620
See application file for complete search history.

(56) References Cited

U.S. PATENT DOCUMENTS

2003/0130812 A1* 7/2003 Haginiwa ....................... 702/94
2004/0223157 A1* 11/2004 Nakajima ..................... 356/401

FOREIGN PATENT DOCUMENTS

JP 63-232321 9/1988
JP 04-032219 2/1992
JP 2004-087562 A 3/2004

OTHER PUBLICATIONS

Office Action issued on Jun. 23, 2009 in corresponding Korean Patent Application No. 10-2007-0124152.

* cited by examiner

Primary Examiner — Edward Glick
Assistant Examiner — Deoram Persaud
(74) Attorney, Agent, or Firm — Rossi, Kimms & McDowell LLP

(57) ABSTRACT

An exposure apparatus exposes each of a plurality of regions arranged on a substrate. The apparatus includes a processor configured to i) cause a measurement device to acquire an image signal of an alignment mark formed in each of plural regions which are at least a part of the plurality of regions and to measure a position of the alignment mark under a plurality of measurement conditions, ii) calculate a feature value of the signal acquired with respect to each of the plural regions under each of the plurality of measurement conditions, and iii) calculate, with respect to each of the plurality of measurement conditions, a coefficient of a transformation equation which transforms a coordinate of a designed position of the alignment mark to a value that approximate the feature value corresponding to the designed position, and a console configured to display information of the calculated coefficients.

11 Claims, 18 Drawing Sheets

EXPOSURE APPARATUS WITH IMPROVED ALIGNMENT MARK POSITION MEASUREMENT CONDITION SETTING FEATURE, AND DEVICE MANUFACTURING METHOD USING THE SAME

BACKGROUND OF THE INVENTION

1. Field of the Invention

The present invention relates to an exposure apparatus for exposing a substrate to radiant energy.

2. Description of the Related Art

Along with micropatterning and an increase in the density of circuits, exposure apparatus for manufacturing semiconductor devices is required to project circuit patterns from reticle surfaces onto substrate surfaces by exposure are required to have ever higher resolving powers. The projection resolving power of the circuit pattern depends on the numerical aperture (NA) of the projection optical system and the exposure wavelength. In view of this, the resolution is increased by adopting a method of increasing the NA of the projection optical system and a method of further shortening the exposure wavelength. In the method of further shortening the exposure wavelength, the wavelength of the exposure light source is shifting from the g-line to the i-line and from the i-line to even the oscillation wavelengths of excimer lasers. Exposure apparatuses having excimer lasers with oscillation wavelengths of 248 nm and 193 nm have already been put into practical use. At present, an exposure scheme using EUV (Extreme Ultra Violet) light with a wavelength of 13 nm is considered to be a candidate for a next-generation exposure scheme.

At the same time, the semiconductor device manufacturing process is diversifying. For example, a chemical mechanical polishing (CMP) process is receiving a great deal of attention as a planarization technique which solves the shortage of the depth of focus of the exposure apparatus. Various kinds of structures and materials of semiconductor devices are also proposed. Examples are a P-high electron mobility transistor and M-high electron mobility transistor formed by combining chemical compounds such as GaAs and InP, and a heterojunction bipolar transistor made of, for example, SiGe and SiGe.

Along with the micropatterning of circuits, another demand has arisen for accurately aligning a reticle on which a circuit pattern is formed and a substrate onto which it is projected. The necessary alignment accuracy is ⅓ the circuit line width. For example, the necessary alignment accuracy for the current 90-nm design is ⅓, that is, 30 nm.

Unfortunately, substrate alignment often causes a wafer-induced shift of the substrate in the manufacturing process, resulting in a decrease in the performance of a semiconductor device and in its manufacturing yield. In this specification, the wafer-induced shift will be referred to as a "WIS". Examples of the WIS are the asymmetry of the structure of an alignment mark and the asymmetry of the shape of a resist applied to a substrate, due to the influence of a planarization process such as CMP. Furthermore, since a semiconductor device is manufactured via a plurality of processes, the optical condition of the alignment mark changes for each process, resulting in a variation in the amount of WIS for each process. To deal with this problem, it is necessary to prepare a plurality of measurement conditions for a plural number of times of alignment to determine an optimal measurement condition for each process. In the conventional substrate alignment, a substrate is actually exposed to light under several measurement conditions and undergoes overlay inspection to determine the measurement condition under which the best result of overlay inspection is obtained. However, this method takes a long period of time to determine the measurement condition. Japanese Patent Laid-Open No. 4-32219 proposes a method of determining the measurement condition using a "value obtained by quantifying the asymmetry or contrast of an alignment mark signal" as an index without overlay inspection. In this specification, a feature value associated with the measurement accuracy calculated from an alignment mark signal, such as the "value obtained by quantifying the asymmetry or contrast of an alignment mark signal" will be referred to as a "feature value".

The measurement condition determination method described in Japanese Patent Laid-Open No. 4-32219 determines the measurement condition using the average of feature values within the substrate surface and their variation as indices. However, since measurement errors are generated at an actual device manufacturing site due to the shift/magnification/rotation of the substrate, it is difficult for the conventional indices to associate them with a WIS which actually poses a problem. This makes it impossible to determine a measurement condition under which the WIS has little influence.

SUMMARY OF THE INVENTION

It is an object of the present invention to improve the measurement accuracy under a measurement condition determined without overlay inspection.

According to a first aspect of the present invention, there is provided an exposure apparatus for exposing each of a plurality of regions arranged on a substrate, the apparatus comprising:

a measurement device configured to acquire an image signal of an alignment mark formed in the region and to measure a position of the alignment mark based on the signal; and a processor configured to i) cause the measurement device to measure a position of the alignment mark formed in each of at least two regions of the plurality of regions, under a plurality of measurement conditions, ii) calculate a feature value of the signal acquired with respect to each of the at least two regions under each of the plurality of measurement conditions, iii) calculate, with respect to each of the plurality of measurement conditions, a coefficient of a transformation equation which transforms a coordinate of a designed position of the alignment mark to a value that approximate the feature value corresponding to the designed position, the transformation equation being formulated from a coordinate transformation equation which transforms a coordinate of the designed position to a value that approximates a coordinate of the measured position corresponding to the designed position, by replacing the measured position with the feature value, and iv) set a measurement condition, under which the measurement device measures the position of the alignment mark, based on the coefficient calculated with respect to each of the plurality of measurement conditions.

According to a second aspect of the present invention, there is provided an exposure apparatus for exposing each of a plurality of regions arranged on a substrate, the apparatus comprising:

a measurement device configured to acquire an image signal of an alignment mark formed in the region and to measure a position of the alignment mark based on the signal; and a processor configured to i) cause the measurement device to measure a position of the alignment mark formed in each of at least two regions of the plurality of regions, under a plurality of measurement conditions, ii) calculate a feature value of the signal acquired with respect to each of the at least two regions under each of the plurality of measurement conditions, and iii) calculate, with respect to each of the plurality of measurement conditions, a coefficient of a transformation equation which transforms a coordinate of a designed position of the alignment mark to a value that approximate the feature value corresponding to the designed position, the transformation equation being formulated from a coordinate transformation equation which transforms a coordinate of the designed position to a value that approximates a coordinate of the measured position corresponding to the designed position, by replacing the measured position with the feature value; and a console configured to display information of the coefficient calculated with respect to each of the plurality of measurement conditions.

According to a third aspect of the present invention, there is provided an exposure apparatus for exposing each of a plurality of regions arranged on a substrate, the apparatus comprising:

a measurement device configured to acquire an image signal of an alignment mark formed in the region and to measure a position of the alignment mark based on the signal; and a processor configured to i) cause the measurement device to measure a position of the alignment mark formed in each of at least two regions of the plurality of regions, under a plurality of measurement conditions, ii) calculate a feature value of the signal acquired with respect to each of the at least two regions under each of the plurality of measurement conditions, iii) calculate, with respect to each of the plurality of measurement conditions, a coefficient of a transformation equation which transforms a coordinate of a designed position of the alignment mark to a value that approximate the feature value corresponding to the designed position, the transformation equation being formulated from a coordinate transformation equation which transforms a coordinate of the designed position to a value that approximates a coordinate of the measured position corresponding to the designed position, by replacing the measured position with the feature value, and iv) set a measurement condition, under which the measurement device measures the position of the alignment mark, based on a variation of the coefficients calculated over a plurality of substrates with respect to each of the plurality of measurement conditions.

According to a fourth aspect of the present invention, there is provided an exposure apparatus for exposing each of a plurality of regions arranged on a substrate, the apparatus comprising:

a measurement device configured to acquire an image signal of an alignment mark formed in the region and to measure a position of the alignment mark based on the signal; and a processor configured to i) cause the measurement device to measure a position of the alignment mark formed in each of at least two regions of the plurality of regions, under a plurality of measurement conditions, ii) calculate a feature value of the signal acquired with respect to each of the at least two regions under each of the plurality of measurement conditions, and iii) calculate, with respect to each of the plurality of measurement conditions, a coefficient of a transformation equation which transforms a coordinate of a designed position of the alignment mark to a value that approximate the feature value corresponding to the designed position, the transformation equation being formulated from a coordinate transformation equation which transforms a coordinate of the designed position to a value that approximates a coordinate of the measured position corresponding to the designed position, by replacing the measured position with the feature value; and a console configured to display a variation of the coefficients calculated over a plurality of substrates with respect to each of the plurality of measurement conditions.

According to the present invention, it is possible to, for example, improve the measurement accuracy under a measurement condition determined without overlay inspection.

Further features of the present invention will become apparent from the following description of exemplary embodiments with reference to the attached drawings.

DESCRIPTION OF THE EMBODIMENTS

Embodiments of the present invention will now be described with reference to the accompanying drawings.

First Embodiment

Figure 1:
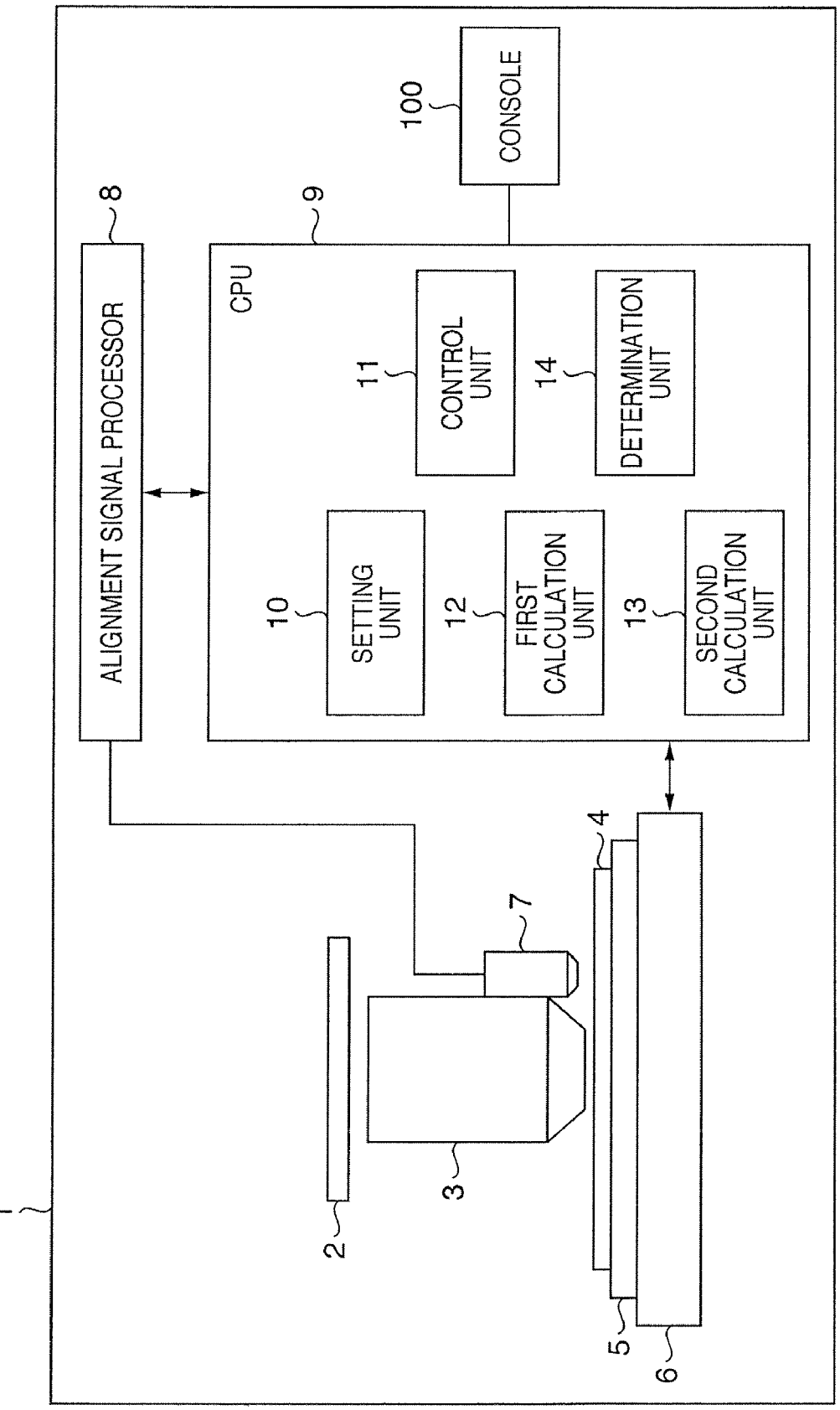
FIG. 1 is a schematic view showing an exposure apparatus.

FIG. 1 is a schematic view showing an exposure apparatus. An exposure apparatus 1 includes, for example, a reduction projection optical system 3 which reduces and projects an image of reticle 2, a substrate chuck 5 which holds a substrate 4, a substrate stage 6 which aligns the substrate 4 to a predetermined position, and an alignment detecting optical system 7. A certain circuit pattern is drawn on the reticle 2. An underlying pattern and an alignment mark are previously formed on the substrate 4. The alignment detecting optical system 7 functions as a measurement device which measures the position of an alignment mark 15 on the substrate 4.

Figure 11:
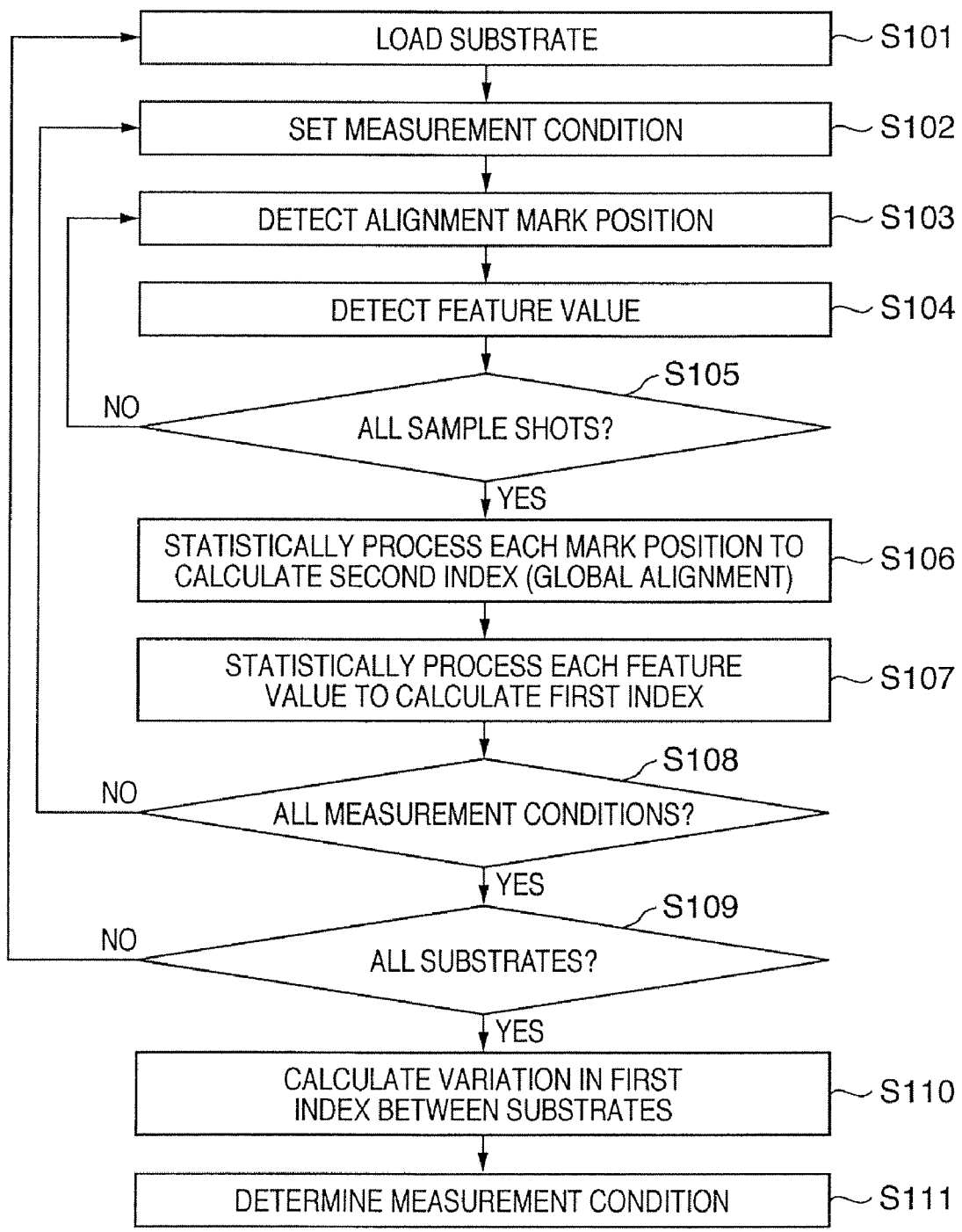
FIG. 11 is a flowchart illustrating a measurement condition determination process according to the first embodiment.

FIG. 11 is a flowchart illustrating the sequence of a measurement condition determination method according to the first embodiment.

In step S101, the substrate 4 is loaded onto the exposure apparatus 1. In step S102, a setting unit 10 in a CPU 9 sets an alignment measurement condition. The measurement condition can be, for example, the measurement illumination condition, the type of alignment mark, the number of sample shots, or the layout of sample shots. The sample shot is a shot region in which an alignment mark 15 is measured to determine the shot arrangement, of a plurality of shot regions in which alignment marks 15 are formed on the substrate 4.

Figure 2:
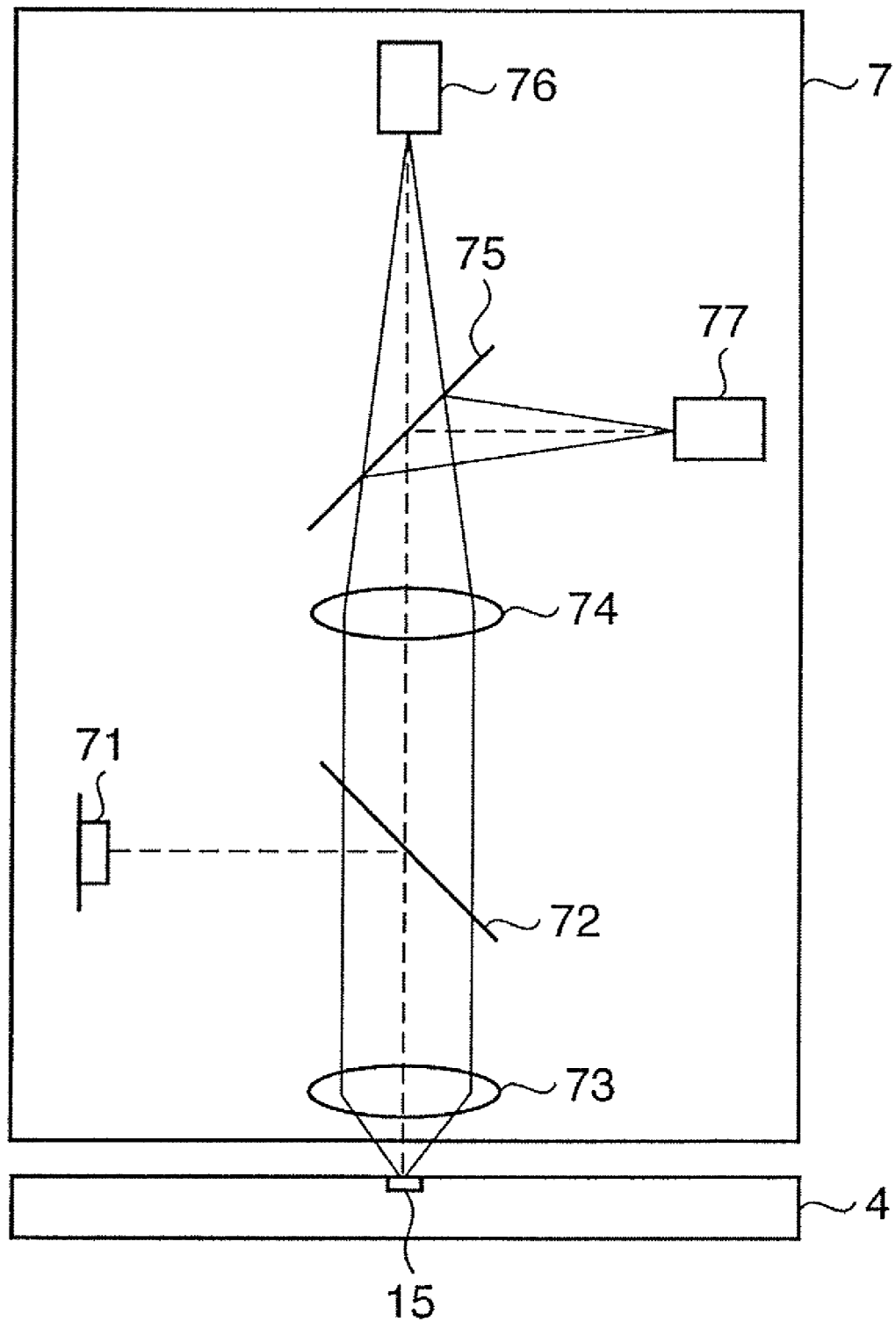
FIG. 2 is a view showing an alignment detecting optical system 7 of FIG. 1.

In step S103, the alignment detecting optical system 7 detects the position of an alignment mark 15 in one sample shot of a set of sample shots on the substrate 4. FIG. 2 is a view showing the main components of the alignment detecting optical system 7. Illumination light from a light source 71 is reflected by a beam splitter 72, passes through a lens 73, and illuminates the alignment mark 15 on the substrate 4. The light diffracted by the alignment mark 15 passes back through the beam splitter 72 and a lens 74 and is split by a beam splitter 75. CCD sensors 76 and 77 receive the split light beams. The alignment mark 15 is enlarged by the lenses 73 and 74 to the degree that the resolution can satisfy the measurement accuracy, and is imaged on the CCD sensors 76 and 77. The CCD sensors 76 and 77 measure displacement of the alignment mark 15 in the X and Y directions, respectively, and have an angular interval of 90° with respect to their optical axes. Since the principles of measurement in the X and Y directions are the same, only position measurement in the X direction will be explained.

Figure 3:
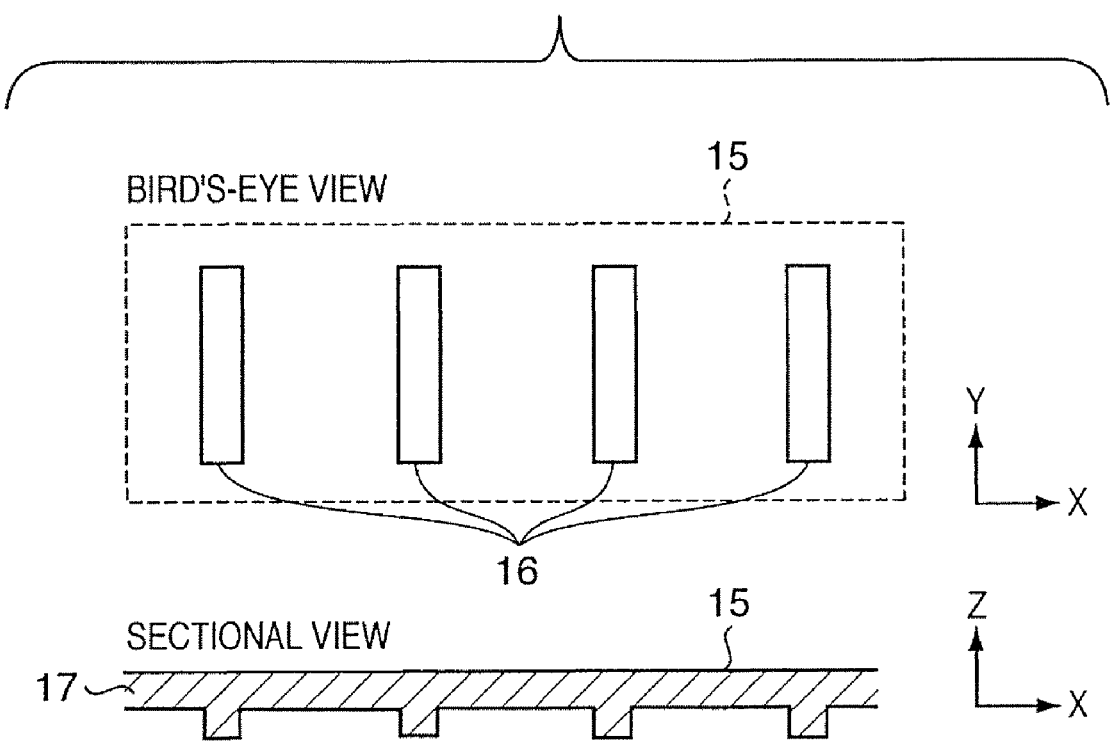
FIG. 3 is a view showing an example of an alignment mark.

FIG. 3 shows an example of the alignment mark 15 used for position measurement. In this example, a plurality of stripe alignment marks 16 having predetermined dimensions in the measurement direction (X direction) and the non-measurement direction (Y direction) are provided in the X direction having a predetermined interval between successive stripes. The alignment mark 15 has a sectional structure recessed by etching and is coated with a resist 17.

Figure 4:
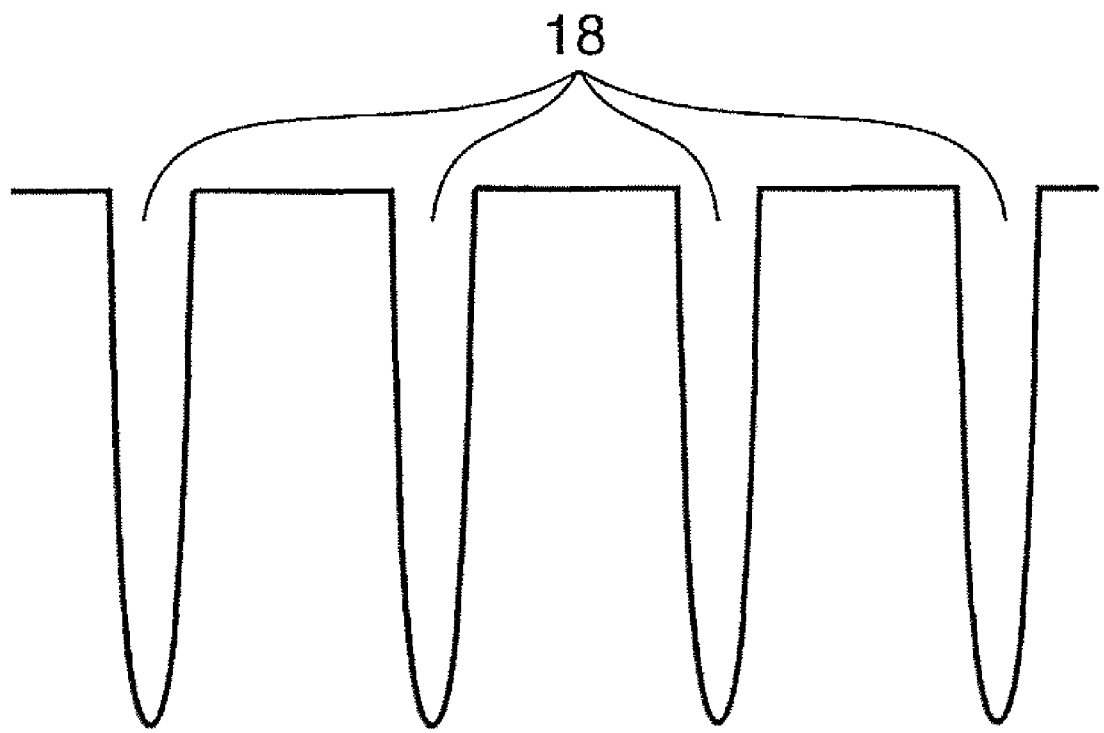
FIG. 4 is a view showing an example of an alignment mark signal.

FIG. 4 shows an example of alignment mark signals 18 when the CCD sensor 76 has received the illumination light reflected by the plurality of stripe alignment marks 16. The alignment mark positions are detected from the corresponding signals 18 shown in FIG. 4. The average of the alignment mark positions is finally calculated and detected as a final alignment mark position.

In step S104, a first calculation unit 12 of the CPU 9 calculates from the signals a feature value W. For example, the feature value W can be calculated by:

$$W = A \times S^a \times C^b \times P^c \quad (1)$$

where S is the asymmetry of the alignment mark signal, C is the contrast (S/N ratio), P is the shape, and A, a, b, and c are constants obtained from the relationship between the feature value W and the WIS.

Figure 5:
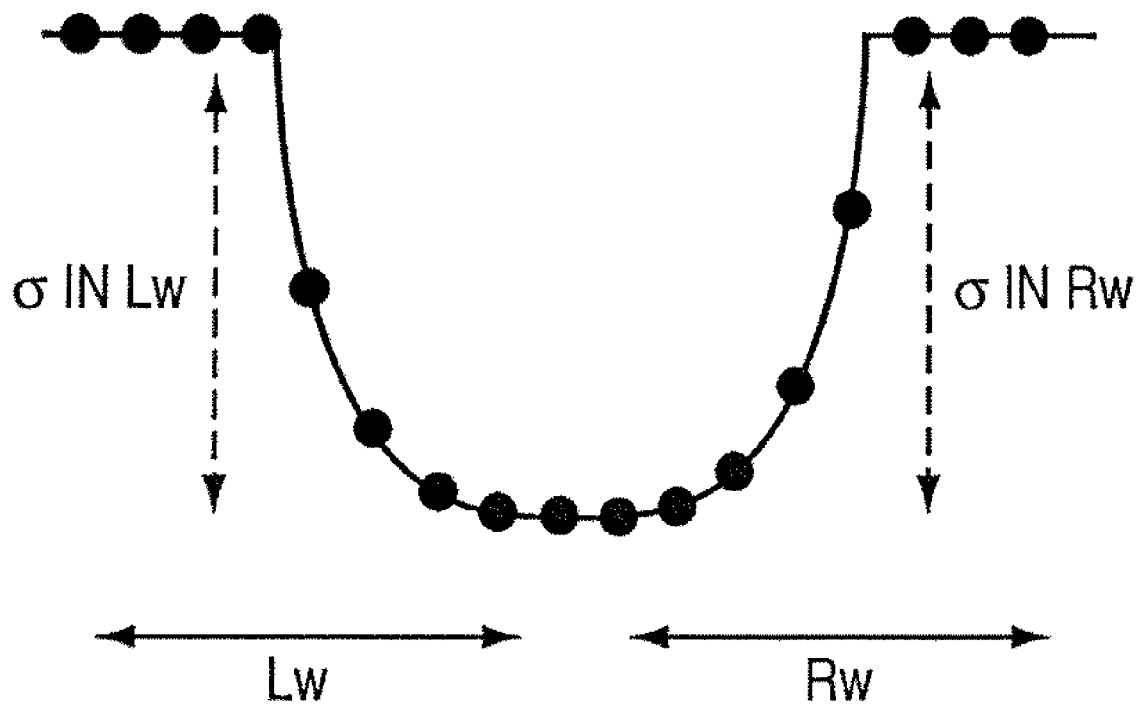
FIG. 5 is an explanatory view showing a feature value.

With respect to a "right processing region Rw" and "left processing region Lw" of a signal shown in FIG. 5, the signal asymmetry S is defined by:

$$S = ((\sigma \text{ in } Rw) - (\sigma \text{ in } Lw))/((\sigma \text{ in } Rw) + (\sigma \text{ in } Lw)) \quad (2)$$

where σ is the standard deviation. The "right processing region Rw" and "left processing region Lw" will be respectively referred to as a "right window" and "left window" hereinafter.

Figure 6:
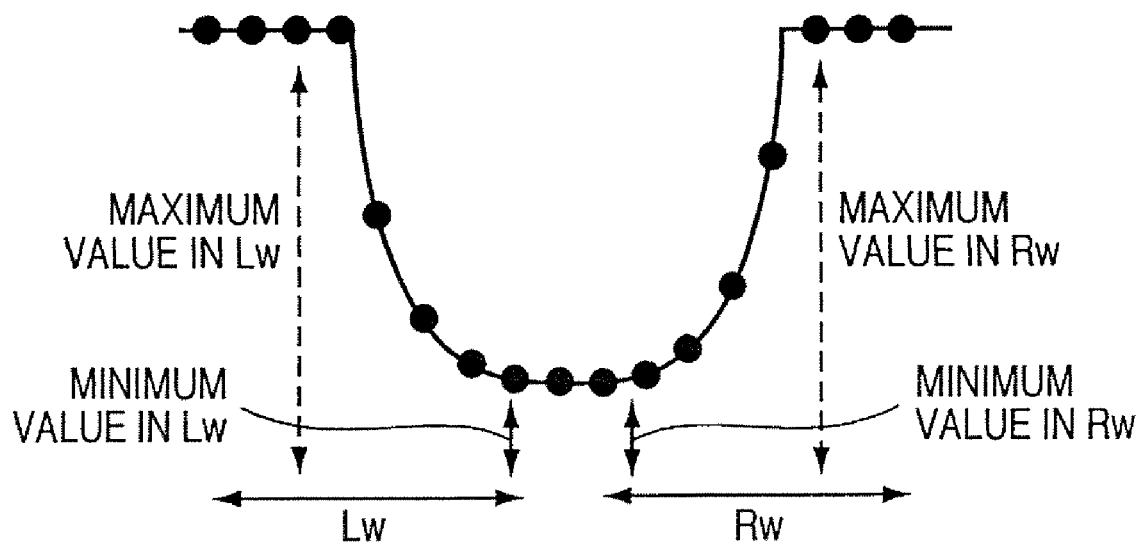
FIG. 6 is an explanatory view showing another feature value.

With respect to a right window Rw and left window Lw of a signal shown in FIG. 6, when (the contrast in $w$) = ((the maximum value in $w$) − (the minimum value in $w$))/((the maximum value in $w$) + (the minimum value in $w$)), the signal contrast C is defined by:

$$C = ((\text{the contrast in } Rw) + (\text{the contrast in } Lw))/2 \quad (3)$$

Figure 7:
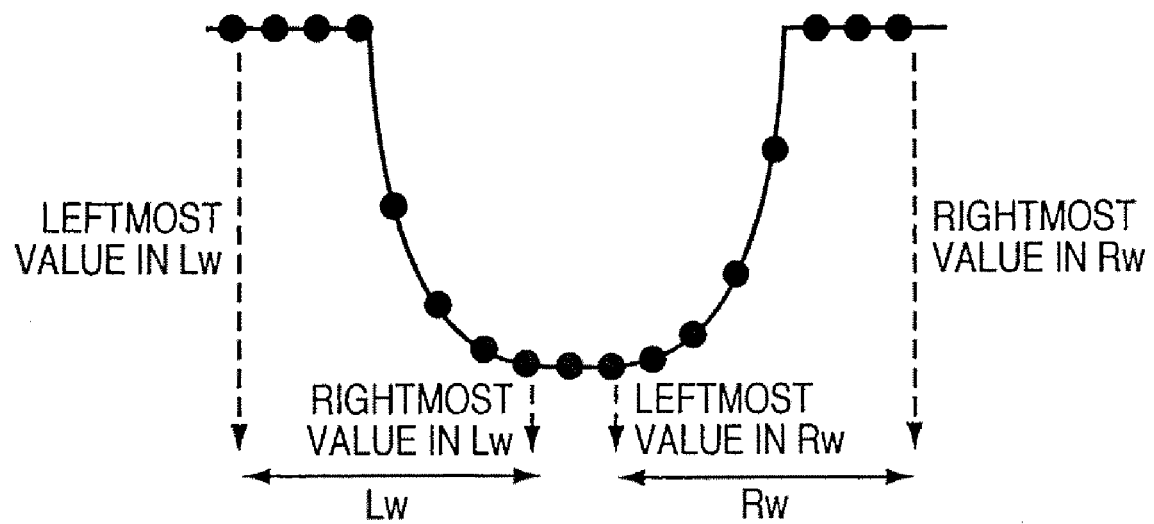
FIG. 7 is an explanatory view showing still another feature value.

With respect to a right window Rw and a left window Lw of a signal shown in FIG. 7, the signal shape P is defined by:

$$P = \{((\text{the rightmost value in } Lw) + (\text{the leftmost value in } Rw)) - ((\text{the leftmost value in } Lw) + (\text{the rightmost value in } Rw))\} / \{((\text{the rightmost value in } Lw) + (\text{the leftmost value in } Rw)) + ((\text{the leftmost value in } Lw) + (\text{the rightmost value in } Rw))\} \quad (4)$$

Figure 8:
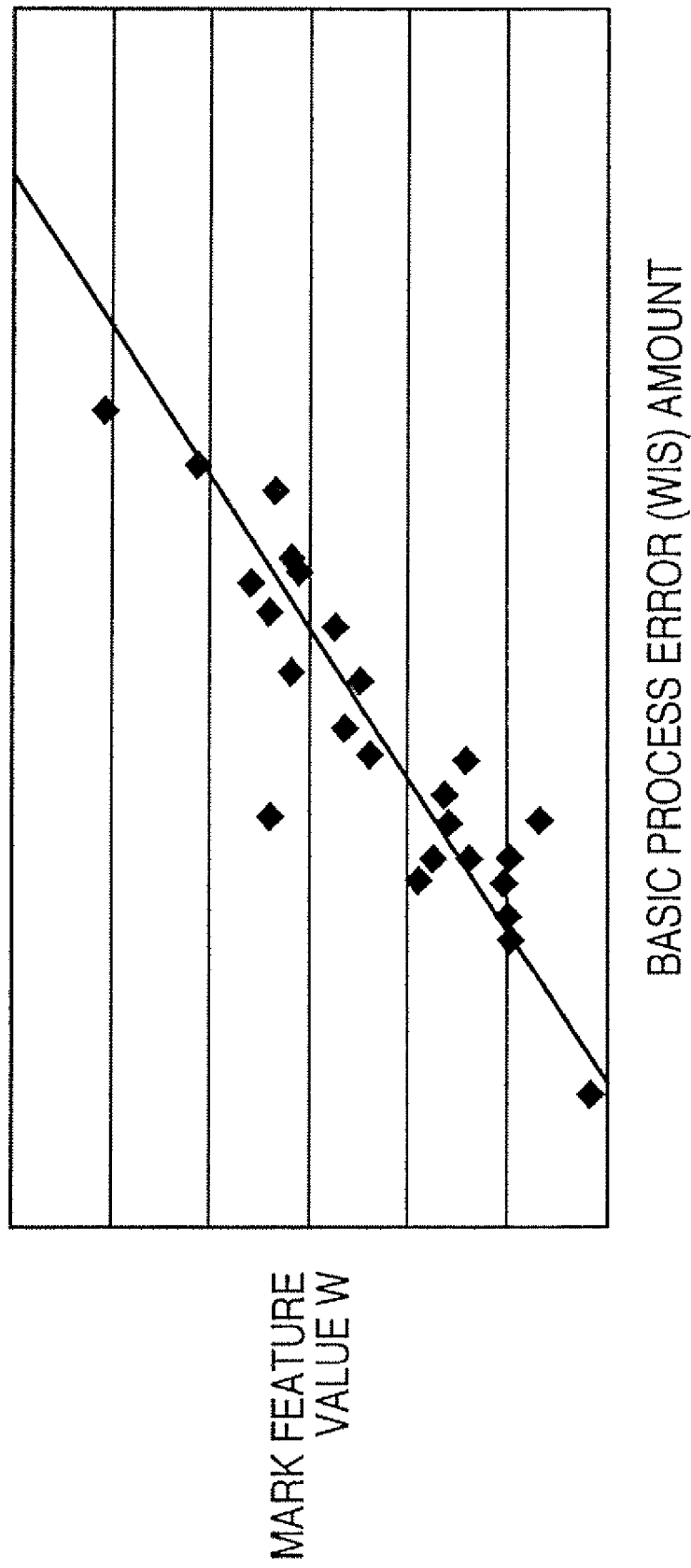
FIG. 8 is a graph showing the correlation between the feature value and the WIS.

An experiment using a substrate which actually suffers a WIS has already confirmed that the feature value W has a correlation with the WIS, as shown in FIG. 8. In other words, calculating the feature value W allows the operator to know "the amount of WIS caused by a signal (to be referred to as "the degree of influence on a WIS" hereinafter)". The first embodiment uses the feature value W as an index for measurement condition determination.

The first calculation unit 12 detects the alignment mark positions in a plurality of sample shots selected from all the shot regions on the substrate, and sequentially calculates their feature values W while repeating the processing operations in steps S103 and S104. After detecting the alignment mark positions in all the sample shots and calculating their feature values W, the process advances to step S106.

In step S106, the alignment mark positions in the respective sample shots are statistically processed to perform global alignment which calculates a second index indicating the amount of displacement of the shot arrangement from a target arrangement. The second index is not based on the feature value W. A second calculation unit 13 of the CPU 9 calculates the second index. Japanese Patent Laid-Open No. 63-232321, for example, describes the global alignment.

A global alignment calculation method will be briefly explained below. The shot arrangement displacement amount can be described using parameters indicating a shift Sx in the X direction, a shift Sy in the Y direction, a rotational angle θx about the X-axis, a rotational angle θy about the Y-axis, a magnification Bx in the X direction, and a magnification By in the Y direction. Letting i be the detection shot number, a detection value Ai in each sample shot is determined by:

$$Ai = \begin{bmatrix} xi \\ yi \end{bmatrix} \quad (5)$$

Coordinates Di of the design position of an alignment mark in each sample shot are determined by:

$$Di = \begin{bmatrix} Xi \\ Yi \end{bmatrix} \quad (6)$$

Using the six parameters (Sx, Sy, θx, θy, Bx, By) indicating the shot arrangement displacement amount described previously, linear coordinate transformation D'i determined by:

$$D'i = \begin{bmatrix} Bx & -\theta y \\ \theta x & By \end{bmatrix} Di + \begin{bmatrix} Sx \\ Sy \end{bmatrix} \quad (7)$$

is performed. Since θx and θy are very small, cos θ=1 and sin θ=θ approximately hold. In addition, since Bx≈1 and By≈1, θx×Bx=θx, θy×By=θy, and the like approximately hold.

Figure 9:
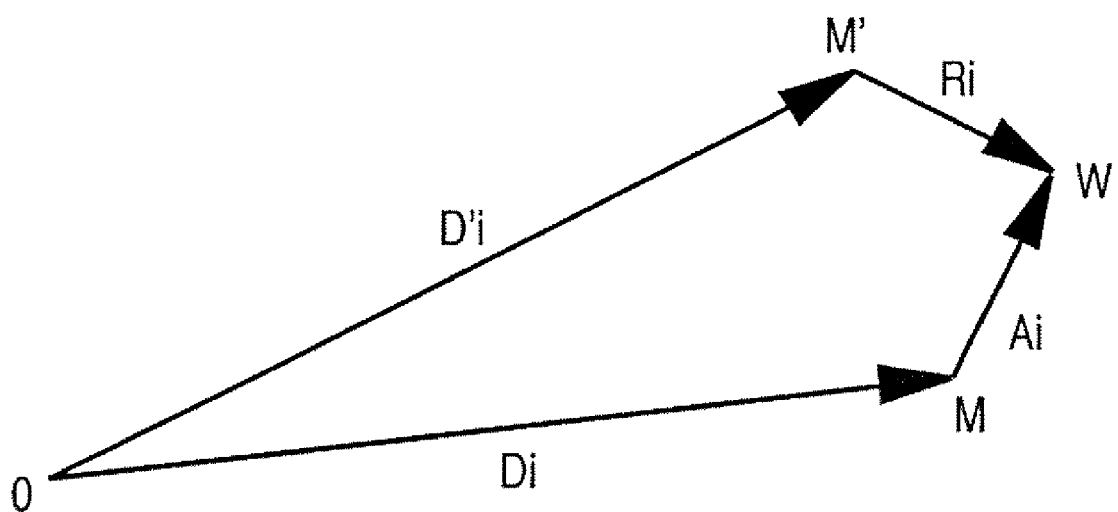
FIG. 9 is an explanatory diagram showing the relationship between coordinate transformation D'i and a correction residual Ri.

As shown in FIG. 9, assume that an alignment mark is formed at a position W on the substrate, which is shifted from a design position M by Ai. When the coordinate transformation D'i is performed, a registration error (to be referred to as a "correction residual" hereinafter) of the alignment mark on the substrate becomes Ri. FIG. 9 is a schematic diagram showing the coordinate transformation D'i and the correction residual Ri. The correction residual Ri is determined by:

$$Ri = (Di + Ai) - D'i \quad (8)$$

The global alignment adopts a least square method so as to minimize the correction residual Ri in each sample shot. That is, when a mean square V of the correction residual Ri is determined by:

$$V = \frac{1}{n} \sum |Ri|^2 \quad (9)$$
$$= \frac{1}{n} \sum_{i=1}^{i=n} \left| \begin{bmatrix} xi \\ yi \end{bmatrix} - \begin{bmatrix} Bx-1 & -\theta y \\ \theta x & By-1 \end{bmatrix} \begin{bmatrix} Xi \\ Yi \end{bmatrix} + \begin{bmatrix} Sx \\ Sy \end{bmatrix} \right|^2$$

shift, rotational, and magnification displacement amounts (Sx, Sy, θx, θy, Bx, By), that is, a shot arrangement displacement amount which minimizes the mean square V is calculated by:

$$\begin{bmatrix} \delta V / \delta Sx \\ \delta V / \delta Sy \\ \delta V / \delta Rx \\ \delta V / \delta Ry \\ \delta V / \delta Bx \\ \delta V / \delta By \end{bmatrix} = 0 \quad (10)$$

The shift, rotational, and magnification displacement amounts (Sx, Sy, θx, θy, Bx, By) are calculated by substituting numerical values to a detection value (xi, yi) and design position (Xi, Yi) in each sample shot in equations (9) and (10).

In the above-described way, the shot arrangement displacement amount is calculated by global alignment.

In step S107, the second calculation unit 13 of the CPU 9 statistically processes the feature values W in all the sample shots to calculate a first index indicating "the amount of displacement of the shot arrangement from a target arrangement". Letting $wx_i$ and $wy_i$ be the feature values of each sample shot, the shot arrangement displacement amount can be calculated by substituting an equation given by:

$$Wi = \begin{bmatrix} wx_i \\ wy_i \end{bmatrix} \quad (11)$$

for equation (5) of global alignment in step S106 and similarly calculating equations (6) to (10). The calculated shot arrangement displacement amount will be described as (WSx, WSy, Wθx, Wθy, WBx, WBy) hereinafter. Calculating the shot arrangement displacement amount makes it possible to transform the amount of WIS which can be generated by a mark signal into the same error component as that which poses a problem at an actual device manufacturing site. This makes it possible to more accurately detect the degree of influence on a WIS.

The processing operations in steps S102 to S107 are repeated while changing the measurement condition to sequentially calculate the first index under each measurement condition. The measurement condition here can use, for example, the illumination condition of the alignment detecting optical system, the type of alignment mark, the number of sample shots, or the layout of sample shots. The setting unit 10 in the CPU 9 sets the measurement condition. The setting unit 10, the first calculation unit 12, the second calculation unit 13, and a determination unit 14 constitute a processor which processes the alignment mark position measurement condition.

A control unit 11 of the CPU 9 controls, for example, the alignment detecting optical system 7 and substrate stage 6 so as to measure the alignment mark under a plurality of set measurement conditions.

The processing operations in steps S102 to S107 are performed for a plurality of substrates to sequentially calculate the first index for each substrate. In step S110, a variation in first indices between substrates is calculated.

A variation in first indices indicating shift, rotational, and magnification displacements between substrates allow the prediction of a displacement component which influences a variation in WIS, and the degree of influence on it under each measurement condition. In other words, it is possible to use the first index as a final index for measurement condition determination.

In step S111, a measurement condition under which the variation in first indices between substrates is a minimum is determined as the measurement condition under which the WIS has a minimum influence, and the series of measurement condition determination steps is ended. The determination unit 14 of the CPU 9 determines the optimum measurement condition.

Using the measurement condition determination process according to the first embodiment makes it possible to easily determine an optimum measurement condition, under which a process error which poses a problem at an actual device manufacturing site is minimal, without overlay inspection.

The shape of an alignment mark according to the third embodiment is not particularly limited to that shown in FIG.

3. The method of calculating the mark feature value W is not particularly limited to that which obtains the calculation result given by equation (1), and may employ any value as long as it has a correlation with the WIS. The selected measurement condition is not particularly limited to the above-described examples. A variation in first index used for measurement condition determination can be given using only a displacement component which poses a problem at an actual device manufacturing site, for example, only a rotational displacement component. It is also possible to use values which are obtained by combining at least two of the group consisting of shift displacement component, rotational displacement component, and magnification displacement component, and are given by:

$$W_{(range)linear} = \sqrt{(W\theta x_{(range)})^2 + (W\theta y_{(range)})^2 + (WBx_{(range)})^2 + (WBy_{(range)})^2} \quad (12)$$

and $$\frac{(WSx_{(range)} + WSy_{(range)})}{2} + W_{(range)linear} \quad (13)$$

Second Embodiment

Figure 12:
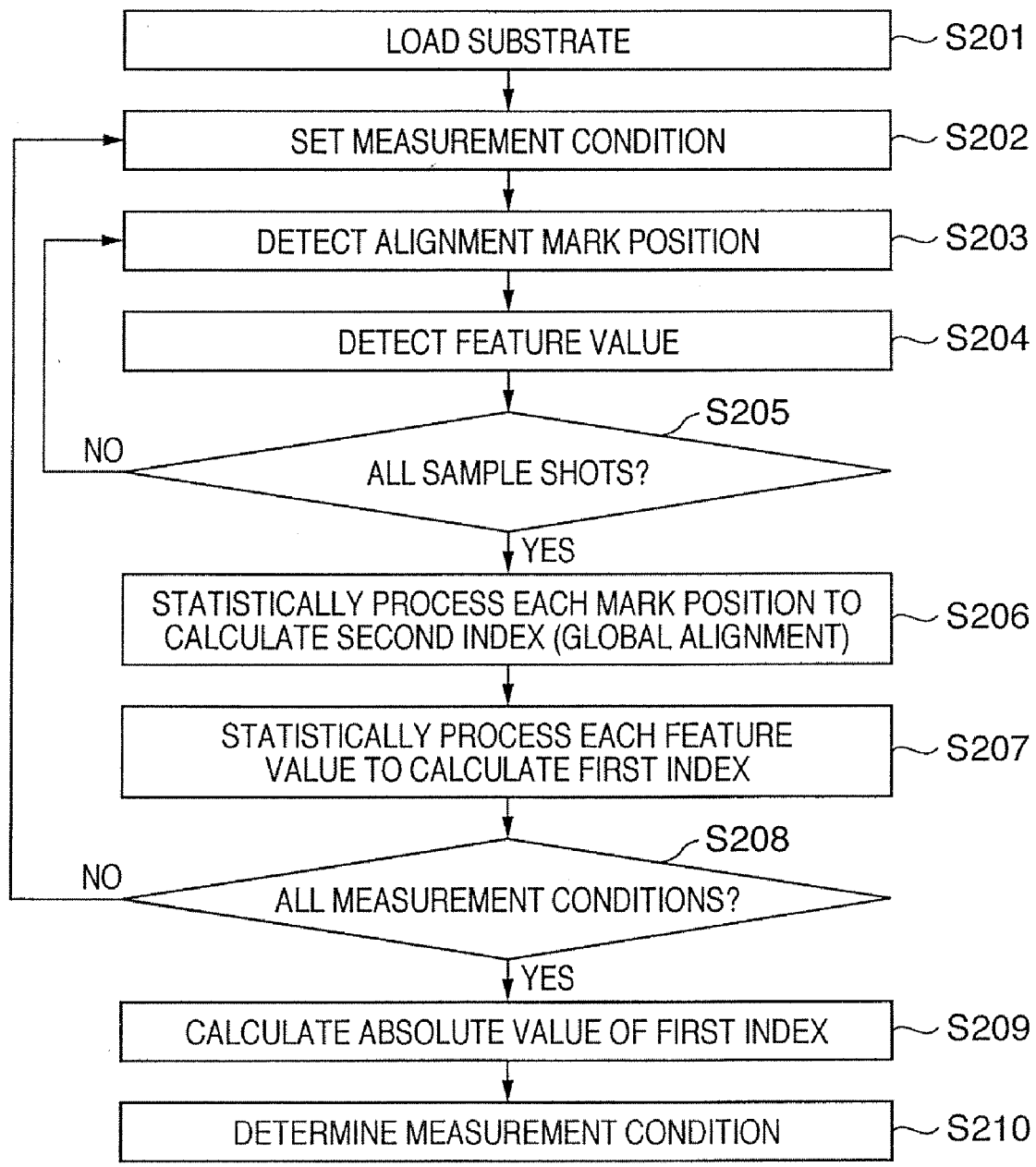
FIG. 12 is a flowchart illustrating a measurement condition determination process according to the second embodiment.

The second embodiment according to the present invention adopts a measurement condition determination process based on the value of a first index for one substrate. The arrangement and operation of an exposure apparatus are the same as those in the first embodiment, except for the measurement condition determination process. The measurement condition determination process according to the second embodiment will be explained with reference to the flowchart shown in FIG. 12. The processing contents in steps S201 to S208 from substrate loading until first index calculation are the same as those in steps S101 to S108.

In the second embodiment, a first index is calculated for one substrate in step S209.

In step S210, the measurement condition under which the first index is a minimum is determined as the measurement condition under which a WIS has a minimum influence, and the series of measurement condition determination steps is ended.

Using the measurement condition determination processes according to the second embodiment makes it possible to decrease the number of substrates measured for measurement condition determination to one, thus shortening the measurement condition determination time.

The first index used for measurement condition determination can be given using only an error component which poses a problem at an actual device manufacturing site, for example, only a rotational displacement component. It is also possible to use values which are obtained by combining at least two of the group consisting of shift displacement component, rotational displacement component, and magnification displacement component, and are given by:

$$W_{linear} = \sqrt{(W\theta x)^2 + (W\theta y)^2 + (WBx)^2 + (WBy)^2} \quad (14)$$

and $$\left|\frac{(WSx + WSy)}{2}\right| + W_{linear} \quad (15)$$

Third Embodiment

Figure 13:
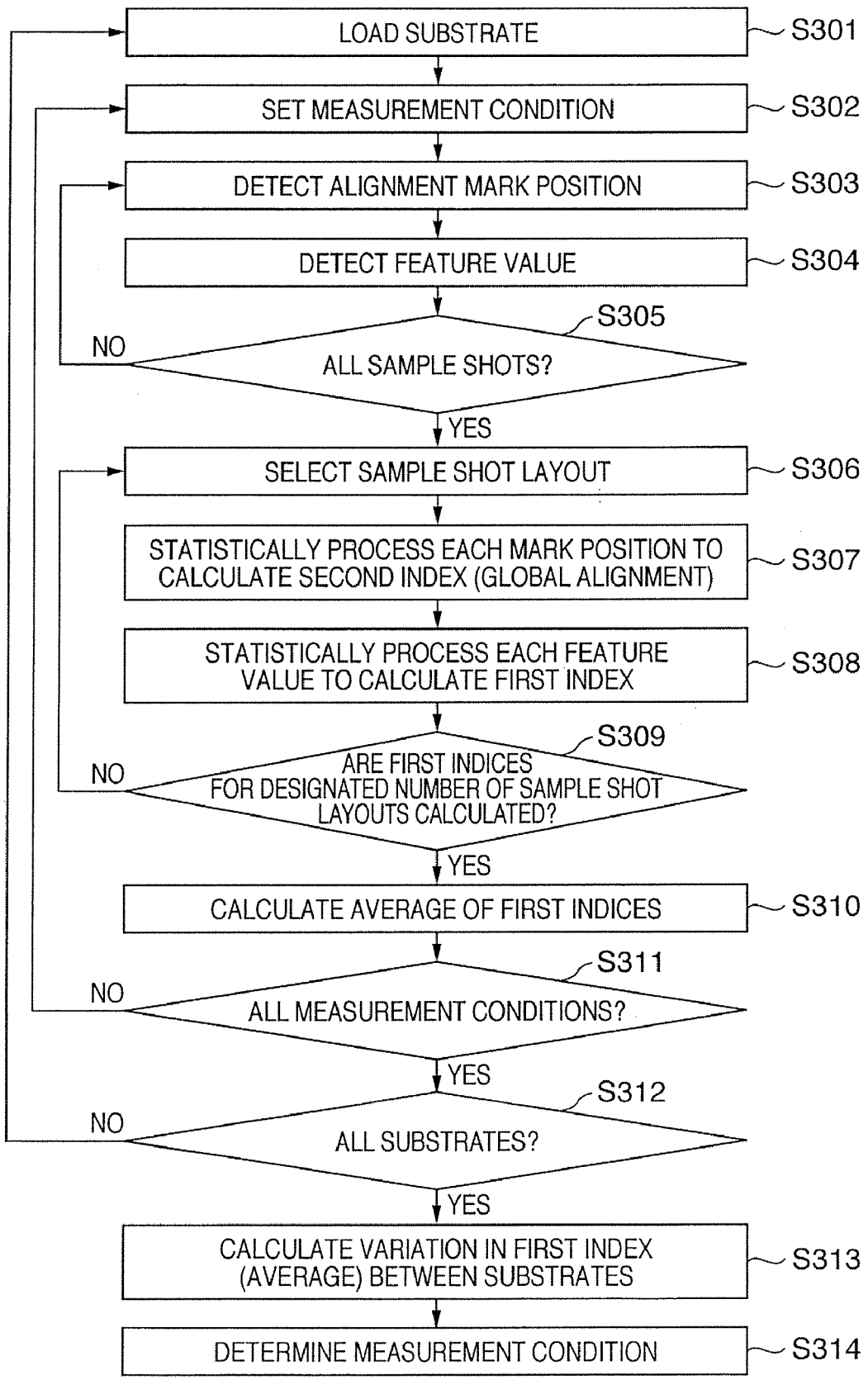
FIG. 13 is a flowchart illustrating a measurement condition determination process according to the third embodiment.

The third embodiment calculates first indices for a plurality of sample shot layouts to determine the measurement condition based on their average. The arrangement and operation of the exposure apparatus are the same as those in the first embodiment except for the measurement condition determination process. A measurement condition determination process according to the third embodiment will be explained with reference to the flowchart in FIG. 13.

The processing contents in steps S301 to S304 from substrate loading until a feature value W is calculated are the same as those in steps S101 to S104. In the third embodiment, the processing operations in steps S301 to S304 are repeated for all the possible sample shot positions for the plurality of sample shot layouts.

Figure 10:
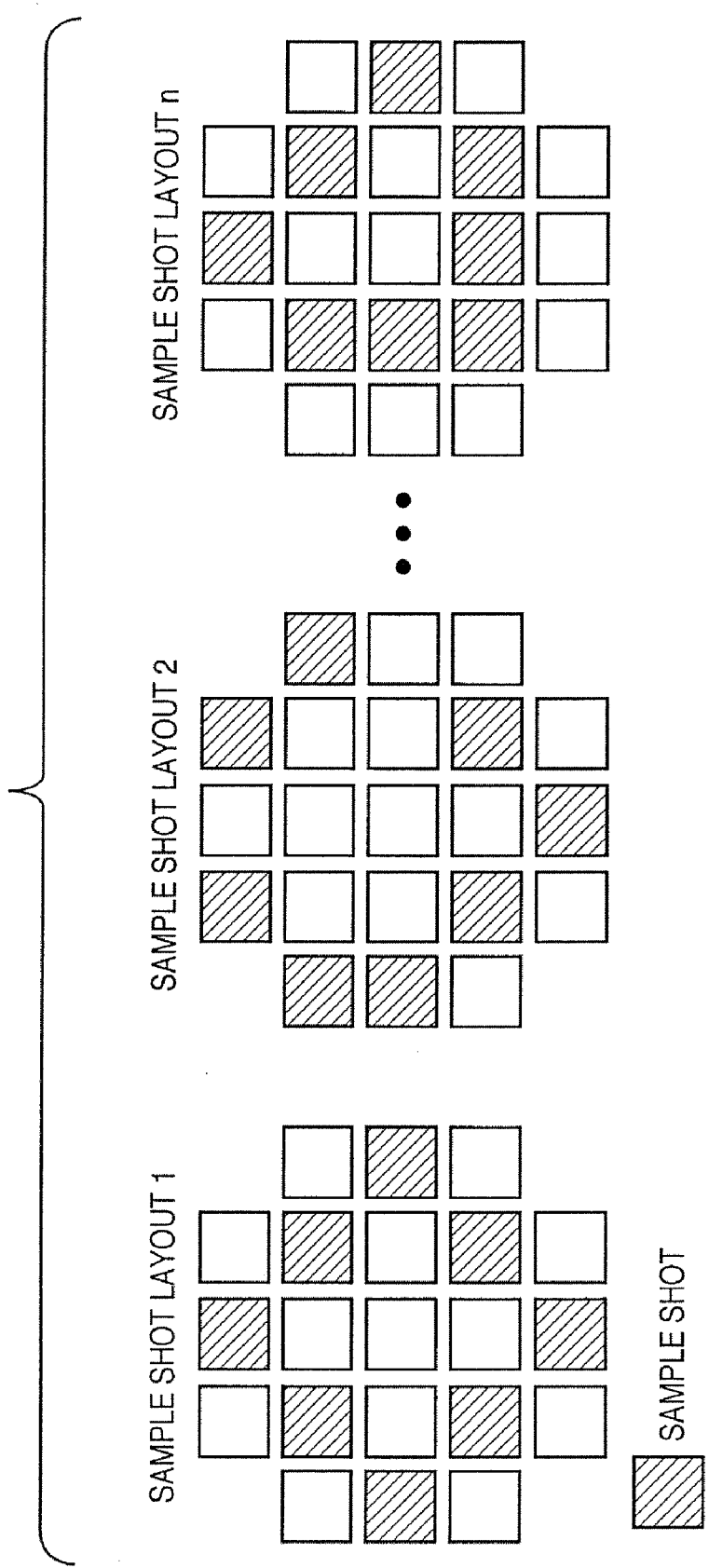
FIG. 10 is a view showing an example of a plurality of sample shot layouts.

In step S306, one sample shot layout 1 is selected from a plurality of sample shot layouts as shown in FIG. 10. The amount of displacement of the shot arrangement from a target arrangement is calculated by global alignment in step S307 and based on the feature value calculated in step S308. The processing contents in steps S307 and S308 are the same as those in steps S106 and S107. The processing operations in steps S307 and S308 are repeated until calculation for n sample shot layouts is completed. In step S310, the average of the amounts of displacement of the shot arrangement from the target arrangement is calculated based on the feature values of the n sample shot layouts. The processing operations in steps S301 to S310 are repeated while changing the measurement condition and substrate. In step S313, a variation in the average of the amounts of displacement of the shot arrangement from the target arrangement between substrates is calculated. An operation for determining the measurement condition from the calculated index in step S314 is the same as that in step S111. According to the third embodiment, it is possible to improve the reproducibility of the shot arrangement displacement amount and the measurement condition determination accuracy. As in the second embodiment, the measurement condition may be determined based on not a variation in shot arrangement displacement amount but the displacement amount itself.

Fourth Embodiment

Figure 14:
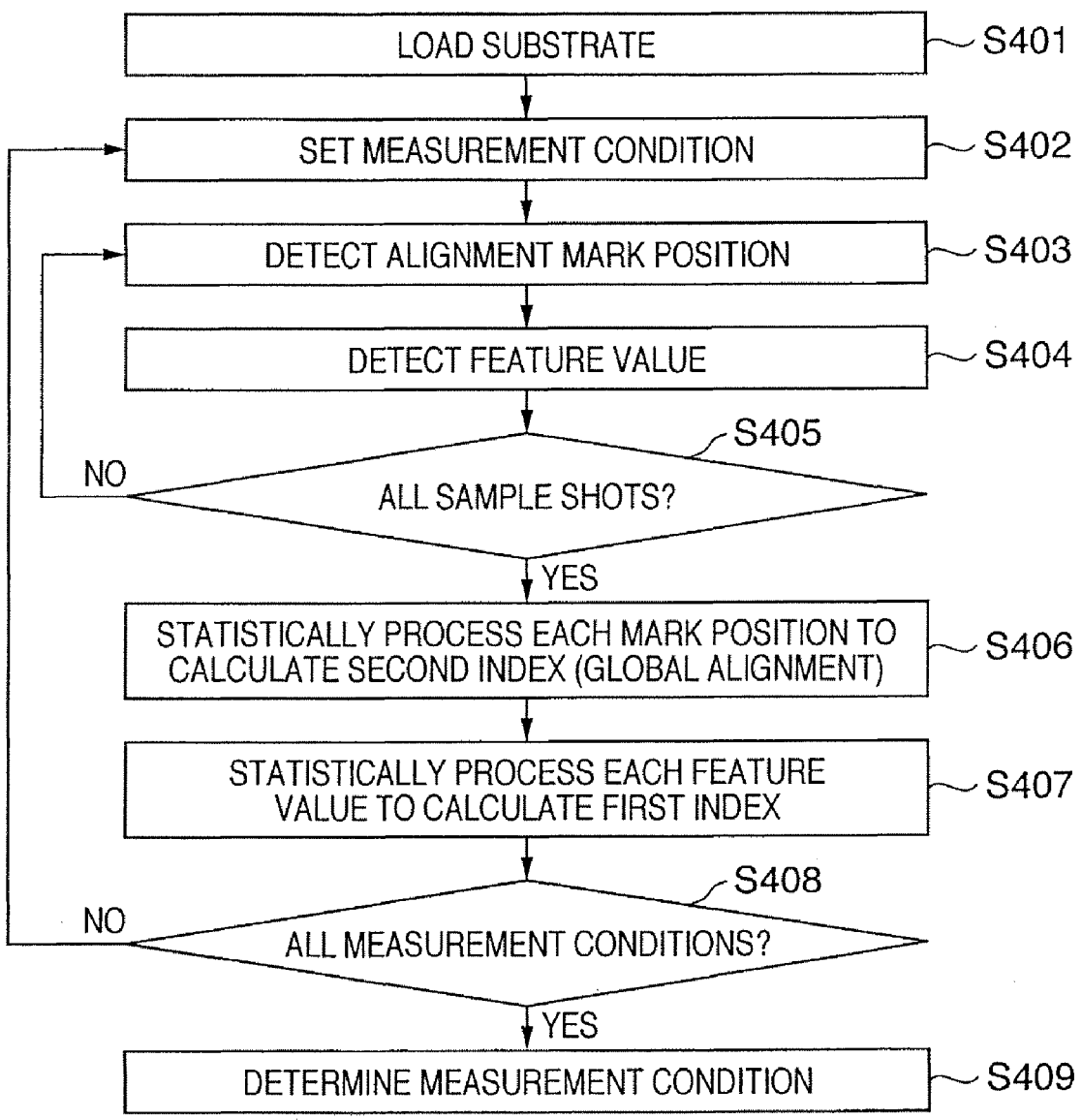
FIG. 14 is a flowchart illustrating a measurement condition determination process according to the fourth embodiment.

The fourth embodiment increases the measurement condition determination accuracy in a process in which a WIS causes a correction residual component. The arrangement and operation of an exposure apparatus are the same as those in the first embodiment except the measurement condition determination process. Only a measurement condition determination process according to the fourth embodiment will be explained with reference to the flowchart shown in FIG. 14.

The processing contents in steps S401 to S406 from substrate loading until global alignment are the same as those in steps S101 to S106. In the fourth embodiment, a residual displacement component other than the shift displacement component, magnification displacement component, and rotational displacement component of the shot arrangement is calculated to obtain its 3σ in step S407, wherein σ is the standard deviation of the residual displacement component.

The residual displacement component of the shot arrangement is Ri obtained by substituting equation (11) for equation (5) and calculating equations (6) to (10). In step S409, the measurement condition is determined using the residual displacement component 3σ of the shot arrangement as the first index, and the series of measurement condition determination steps is ended. This makes it possible to determine the measurement condition even if a WIS generates an error of the residual displacement component. As in the third embodiment, the average of a plurality of sample shot layouts may be used.

Fifth Embodiment

Figure 15:
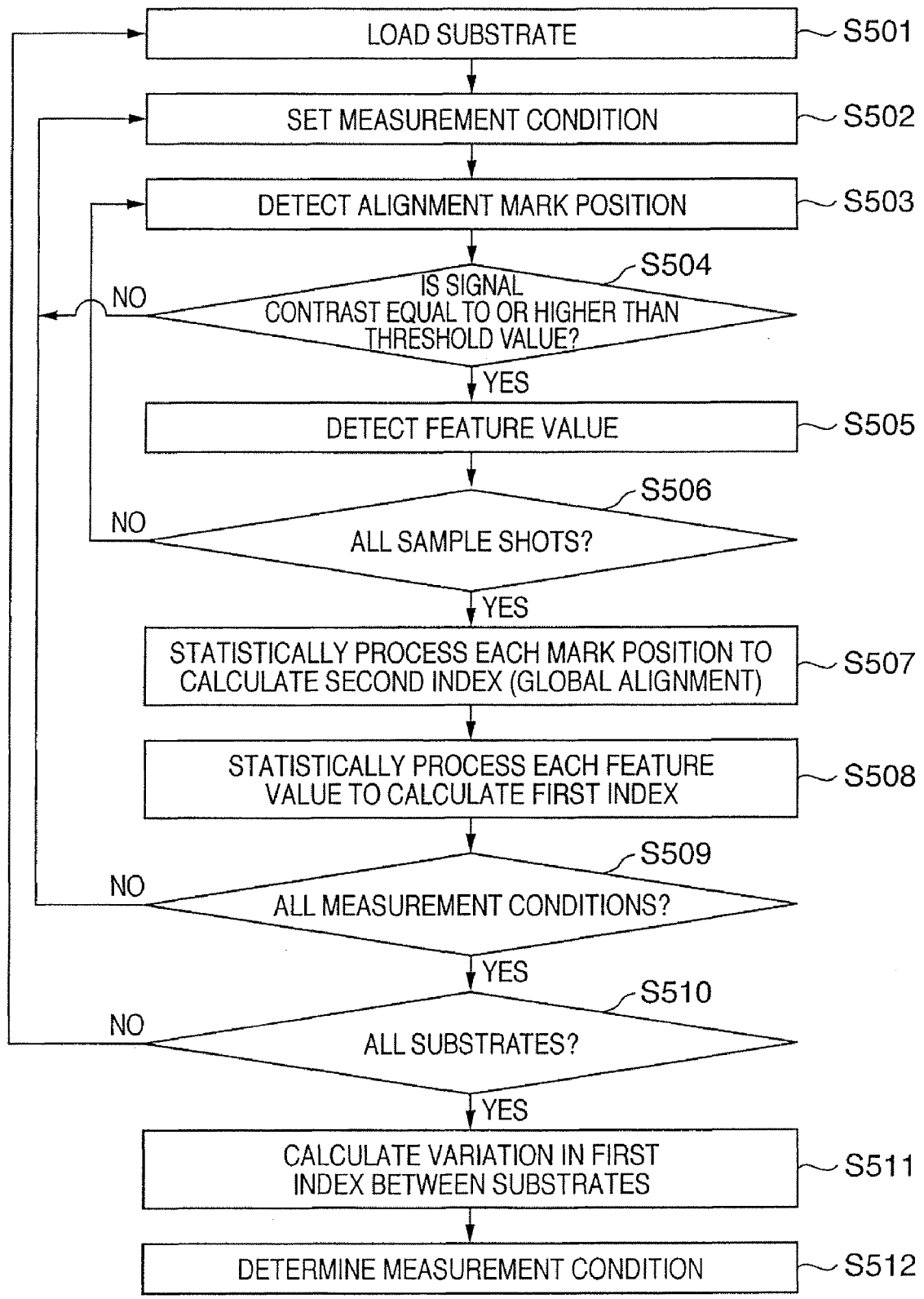
FIG. 15 is a flowchart illustrating a measurement condition determination process according to the fifth embodiment.

The fifth embodiment shortens the measurement condition determination time and improves the determination accuracy by excluding from candidates at the start any measurement condition under which a mark signal contrast (S/N ratio) C defined by equation (3) is low. The arrangement and operation of an exposure apparatus are the same as those in the first embodiment except for the measurement condition determination process. The measurement condition determination process according to the fifth embodiment will be explained with reference to the flowchart shown in FIG. 15. The processing contents in steps S501 to S503 from substrate loading until alignment mark position detection are the same as those in steps S101 to S103. In the fifth embodiment, if it is determined in step S504 that the signal contrast (S/N ratio) is lower than a set threshold value, the measurement condition at this time is excluded from determination candidates. This is because when the mark signal contrast becomes equal to or lower than a predetermined threshold value, the signal S/N ratio rapidly decreases. This results in a significant decrease in alignment accuracy due to noise. Further, since the correlation between a feature value W and the WIS shown in FIG. 8 weakens, there is a possibility that the index cannot be accurately calculated under a measurement condition under which the contrast is equal to or lower than the predetermined threshold value. The subsequent processing operations for a measurement condition, which remains as a candidate, in steps S505 to S512 are the same as those in steps S104 to S111. According to the fifth embodiment, it is possible to shorten the measurement condition determination time and improve the determination accuracy when there is a measurement condition under which the contrast is equal to or lower than the set threshold value. The processing operation in step S504 according to the fifth embodiment may also be applied to the second to fourth embodiments.

Sixth Embodiment

Figure 16:
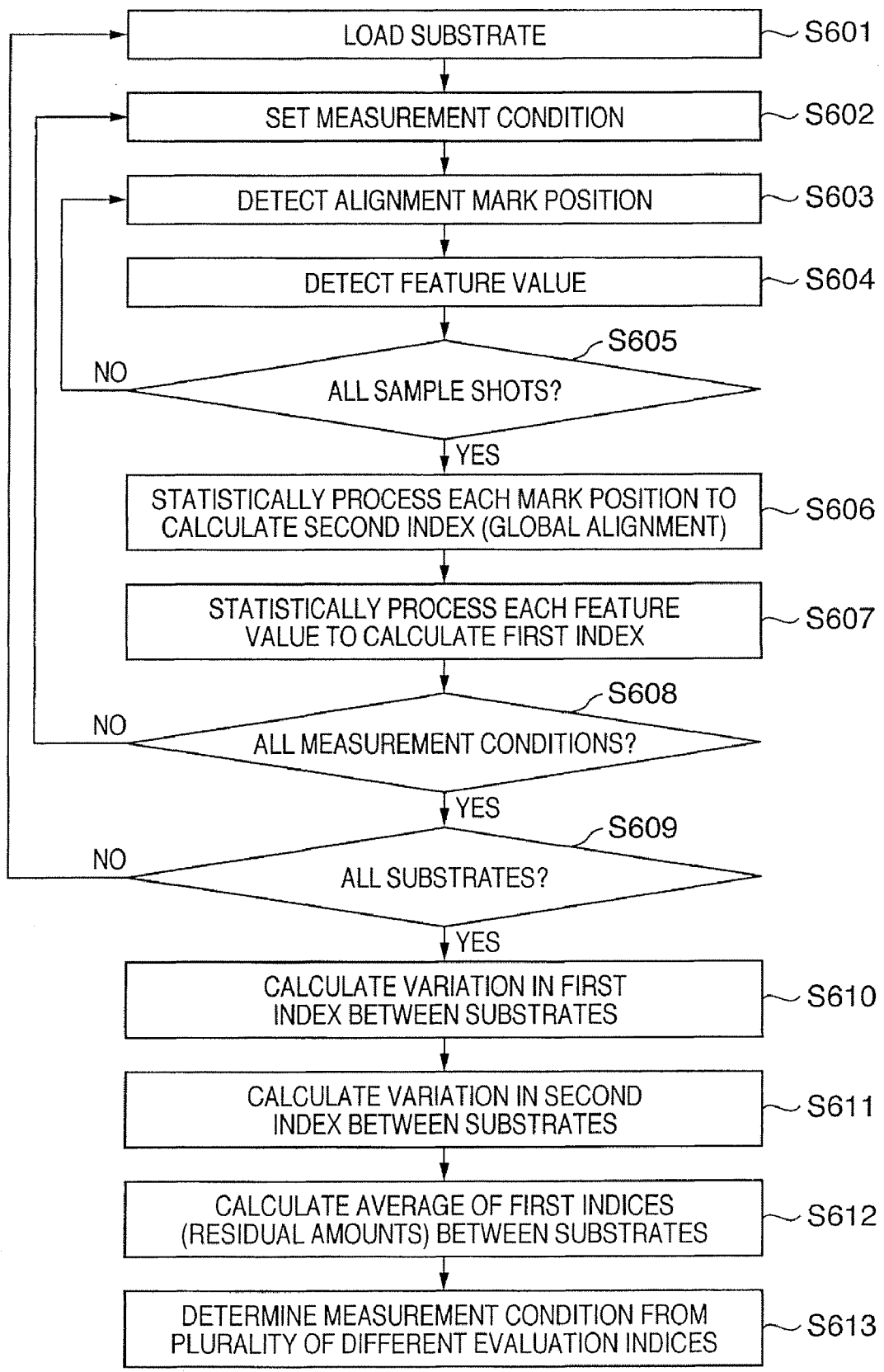
FIG. 16 is a flowchart illustrating a measurement condition determination process according to the sixth embodiment.

The sixth embodiment according to the present invention adopts a process of increasing the measurement condition determination reliability by determining a final measurement condition using a plurality of different indices. The arrangement and operation of an exposure apparatus are the same as those in the first embodiment except for the measurement condition determination process. The measurement condition determination process according to the sixth embodiment will be explained with reference to the flowchart shown in FIG. 16. The processing contents in steps S601 to S610 (from substrate loading until a variation in the amounts of displacement of the shot arrangement from a target arrangement between substrates, which is based on the feature value, is calculated) are the same as those in steps S101 to S110. In the sixth embodiment, in step S611, the variation in the magnification displacement component of the shot arrangement between substrates, which is not based on the feature value and calculated in step S606, is used as one index for measurement condition determination. In step S612, a standard deviation Ri (3σ) of a correction residual Ri which is defined by equation (8) and calculated in step S606 is calculated to obtain its average Ri(3∝)$_{(ave)}$. The calculated average Ri(3σ) (ave) is used as one index for measurement condition determination. In step S613, a final measurement condition is determined using the weighted average of the indices calculated in steps S610 to S612, and the series of measurement condition determination steps is ended. According to the sixth embodiment, it is possible to increase the measurement condition determination reliability as compared with that based on only one index. The type and combination of indices are not particularly limited to those used in steps S610 to S612, and can use the shot arrangement displacement amount as in the second embodiment. The variation in shot arrangement displacement between substrates, which is not based on the feature value and used in step S611, is not particularly limited to that in magnification displacement component. The final measurement condition determination method in step S613 is not particularly limited to the calculation of the weighted average of the indices.

Variation Embodiment

In the embodiments mentioned above, the CPU 9 automatically sets a measurement condition based on the first indices which are coefficients of equation (7) of a coordinate transformation calculated by substituting equation (11) for equation (5), or based on the variation such as standard deviation in the first indices of a plurality of substrates. However, the first indices calculated under each of a plurality of measurement conditions or the variation in the first indices of a plurality of substrates can be displayed on a display unit by the CPU 9, and, based on the displayed information, a user of the exposure apparatus 1 can set a preferred measurement condition. Here, the display unit can be included, for example, in the console connected the CPU 9 of the exposure apparatus 1.

[Device Manufacture]

Figure 17:
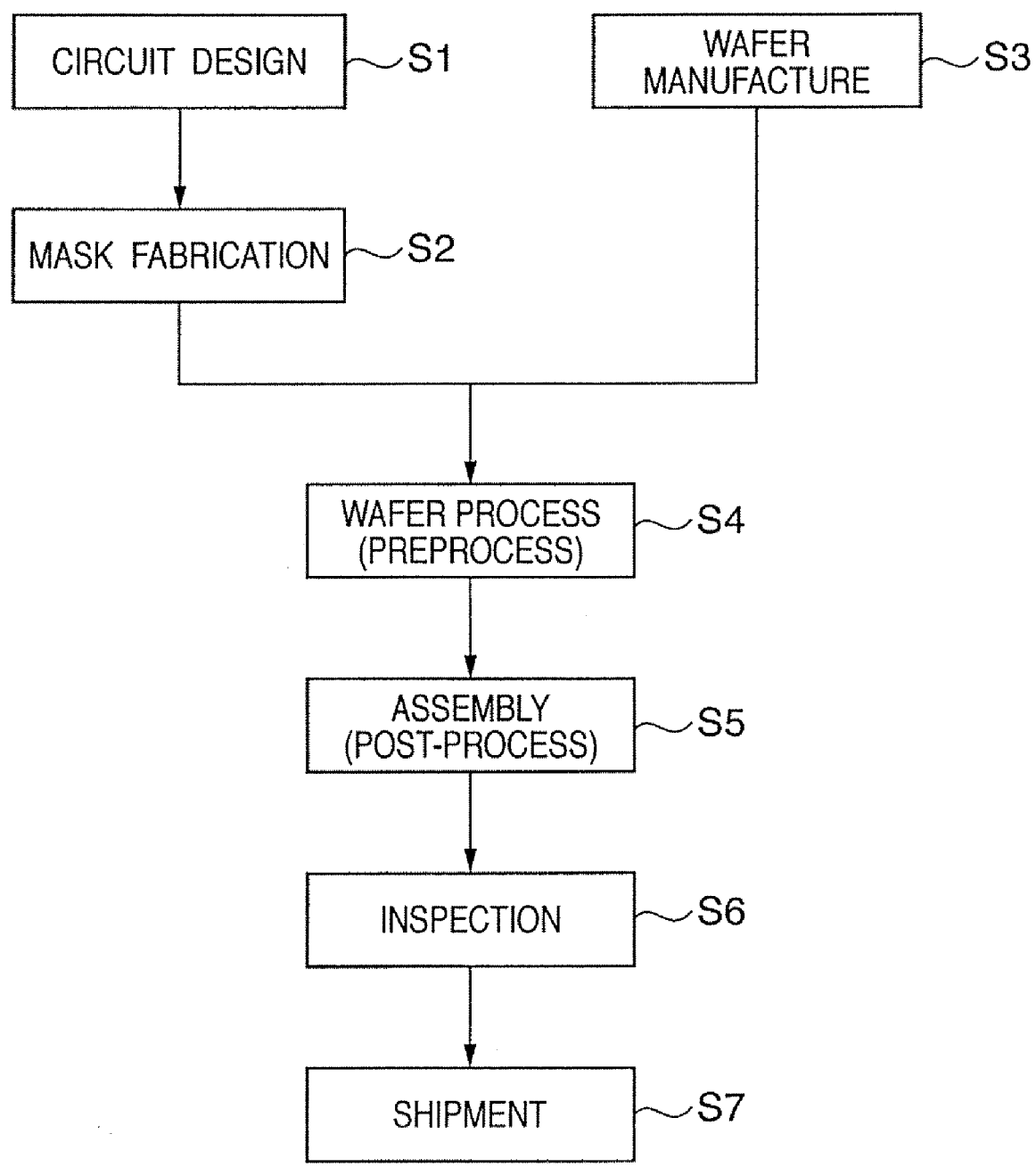
FIG. 17 is a flowchart for explaining the device manufacture using an exposure apparatus.

A device manufacturing method using the above-described exposure apparatus will be explained next with reference to FIGS. 17 and 18. FIG. 17 is a flowchart for explaining the manufacture of a device (e.g., a semiconductor chip such as an IC or LSI, an LCD, or a CCD). A semiconductor chip manufacturing method will be exemplified here.

In step S1 (circuit design), the circuit of a semiconductor device is designed. In step S2 (mask fabrication), a mask (also called a master or reticle) is fabricated based on the designed circuit pattern. In step S3 (wafer manufacture), a wafer (also called a substrate) is manufactured using a material such as silicon. In step S4 (wafer process) called a pre-process, the above-described exposure apparatus forms an actual circuit on the substrate by lithography using the mask and substrate. In step S5 (assembly) called a post-process, a semiconductor chip is formed using the substrate manufactured in step S4. This step includes an assembly step (dicing and bonding) and packaging step (chip encapsulation). In step S6 (inspection), the semiconductor device manufactured in step S5 undergoes inspections such as an operation confirmation test and durability test. After these steps, the semiconductor device is completed and shipped in step S7.

Figure 18:
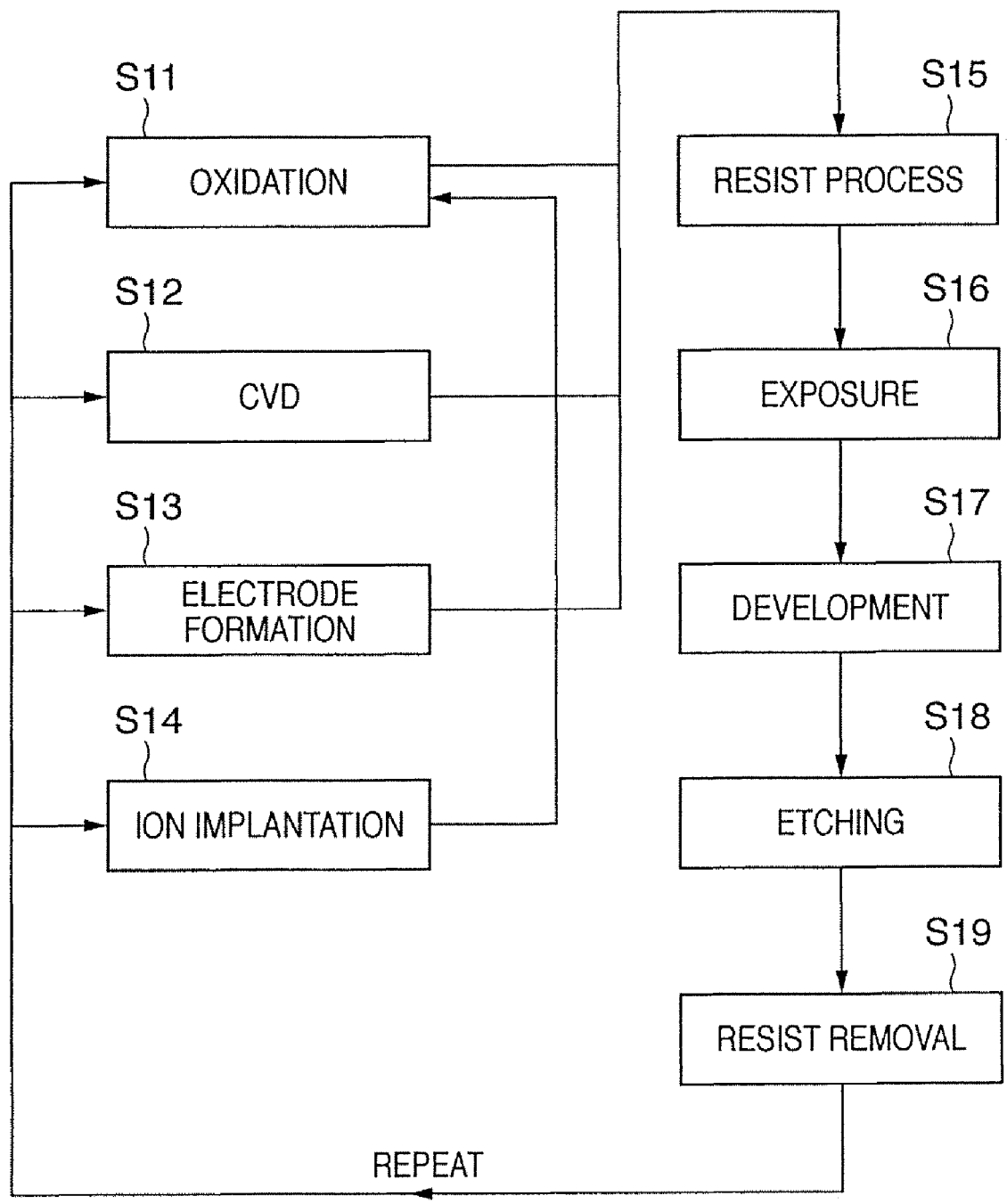
FIG. 18 is a flowchart illustrating details of the wafer process in step S4 of the flowchart shown in FIG. 17.

FIG. 18 is a flowchart illustrating details of the wafer process in step S4. In step S11 (oxidation), the substrate surface is oxidized. In step S12 (CVD), an insulating film is formed on the substrate surface. In step S13 (electrode formation), an electrode is formed on the substrate by deposition. In step S14 (ion implantation), ions are implanted into the substrate. In step S15 (resist process), a photosensitive agent is applied to the substrate. In step S16 (exposure), the circuit pattern of the mask is transferred onto the substrate by exposure using the above-described exposure apparatus. In step S17 (development), the exposed substrate is developed. In step S18 (etching), portions other than the developed resist image are etched. In step S19 (resist removal), any unnecessary resist remaining after etching is removed. By repeating these steps, a multilayered structure of circuit patterns is formed on the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-327637 filed Dec. 4, 2006 and Japanese Patent Application No. 2007-306313 filed Nov. 27, 2007, which are hereby incorporated by reference herein in their entirety.

What is claimed is:

1. An exposure apparatus for exposing each of a plurality of regions arranged on a substrate, the apparatus comprising:
    a measurement device configured to acquire an image signal of an alignment mark formed with respect to the shot region and to measure a shift amount of a position of the alignment mark from a designed position thereof based on the signal; and
    a processor configured to:
    i) cause the measurement device to measure the shift amount with respect to each of at least two shot regions of the plurality of shot regions, under a plurality of measurement conditions,
    ii) calculate a feature value of the signal acquired with respect to each of the at least two shot regions under each of the plurality of measurement conditions,
    iii) calculate, with respect to each of the plurality of measurement conditions, a coefficient of a transformation equation which respectively transforms coordinates of designed positions of the alignment marks to values that approximate values each of which is obtained with a sum of the calculated feature value and one of the designed positions corresponding thereto,
        wherein the transformation equation is formulated from a coordinate transformation equation which is used to obtain a position of each of the plurality of shot regions, and respectively transforms the coordinates of the designed positions to values that respectively approximate coordinates of measured positions of the alignment marks each of which is obtained with a sum of the measured shift amount and one of the designed positions corresponding thereto with respect to each of the at least two shot regions, by replacing the measured shift amount with the calculated feature value corresponding thereto, and
    iv) set a measurement condition, under which the measurement device measures the shift amount, based on the coefficient calculated with respect to each of the plurality of measurement conditions.

2. An exposure apparatus according to claim 1, wherein the feature value includes at least one member of the group consisting of: a value representing asymmetry of the signal, a value representing contrast of the signal, and a value representing a shape of the signal.

3. An exposure apparatus according to claim 1, wherein the processor is configured to set one of the plurality of measurement conditions under which the coefficient is a minimum.

4. A method of manufacturing a device, said method comprising the steps of:
    exposing a substrate to radiant energy using an exposure apparatus defined in claim 1;
    developing the exposed substrate; and
    processing the developed substrate to manufacture the device.

5. An exposure apparatus for exposing each of a plurality of shot regions arranged on a substrate, the apparatus comprising:
    a measurement device configured to acquire an image signal of an alignment mark formed with respect to the shot region and to measure shift amount of a position of the alignment mark from a designed position thereof based on the signal;
    a processor configured to:
    i) cause the measurement device to measure the shift amount with respect to each of at least two shot regions of the plurality of shot regions, under a plurality of measurement conditions,
    ii) calculate a feature value of the signal acquired with respect to each of the at least two shot regions under each of the plurality of measurement conditions, and
    iii) calculate, with respect to each of the plurality of measurement conditions, a coefficient of a transformation equation which respectively transforms coordinates of designed positions of the alignment marks to values that approximate values each of which is obtained with a sum of the calculated feature value and one of the designed positions corresponding thereto,
        wherein the transformation equation is formulated from a coordinate transformation equation which is used to obtain a position of each of the plurality of shot regions, and respectively transforms the coordinates of the designed positions to values that respectively approximate coordinates of measured positions of the alignment marks each of which is obtained with a sum of the measured shift amount and one of the designed positions corresponding thereto with respect to each of the at least two shot regions, by replacing the measured shift amount with the calculated feature value corresponding thereto; and
    a console configured to display information of the coefficient calculated with respect to each of the plurality of measurement conditions.

6. A method of manufacturing a device, said method comprising the steps of:
    exposing a substrate to radiant energy using an exposure apparatus defined in claim 5;
    developing the exposed substrate; and
    processing the developed substrate to manufacture the device.

7. An exposure apparatus for exposing each of a plurality of shot regions arranged on a substrate, the apparatus comprising:
    a measurement device configured to acquire an image signal of an alignment mark formed with respect to the shot region and to measure a shift amount of a position of the alignment mark from a designed position thereof based on the signal; and a processor configured to:
i) cause the measurement device to measure the shift amount with respect to each of at least two shot regions of the plurality of shot regions, under a plurality of measurement conditions,
ii) calculate a feature value of the signal acquired with respect to each of the at least two shot regions under each of the plurality of measurement conditions,
iii) calculate, with respect to each of the plurality of measurement conditions, a coefficient of a transformation equation which respectively transforms coordinates of designed positions of the alignment marks to values that approximate values each of which is obtained with a sum of the calculated feature value and one of the designed positions corresponding thereto,
wherein the transformation equation is formulated from a coordinate transformation equation which is used to obtain a position of each of the plurality of shot regions, and respectively transforms the coordinates of the designed positions to values that respectively approximate coordinates of measured positions of the alignment marks each of which is obtained with a sum of the measured shift amount and one of the designed positions corresponding thereto with respect to each of the at least two shot regions, by replacing the measured shift amount with the calculated feature value corresponding thereto, and
iv) set a measurement condition, under which the measurement device measures the shift amount, based on a variation of the coefficients calculated over a plurality of substrates with respect to each of the plurality of measurement conditions.

8. An exposure apparatus according to claim 7, wherein the processor is configured to set one of the plurality of measurement conditions under which the variation of the coefficients is a minimum.

9. A method of manufacturing a device, said method comprising the steps of:
exposing a substrate to radiant energy using an exposure apparatus defined in claim 7;
developing the exposed substrate; and
processing the developed substrate to manufacture the device.

10. An exposure apparatus for exposing each of a plurality of shot regions arranged on a substrate, the apparatus comprising:
a measurement device configured to acquire an image signal of an alignment mark formed with respect to the shot region and to measure a shift amount of a position of the alignment mark from a designed position thereof based on the signal;
a processor configured to:
i) cause the measurement device to measure the shift amount with respect to each of at least two shot regions of the plurality of shot regions, under a plurality of measurement conditions,
ii) calculate a feature value of the signal acquired with respect to each of the at least two shot regions under each of the plurality of measurement conditions, and
iii) calculate, with respect to each of the plurality of measurement conditions, a coefficient of a transformation equation which respectively transforms coordinates of designed positions of the alignment marks to values that approximate values each of which is obtained with a sum of the calculated feature value and one of the designed positions corresponding thereto,
wherein the transformation equation is formulated from a coordinate transformation equation which is used to obtain a position of each of the plurality of shot regions, and respectively transforms the coordinates of the designed positions to values that respectively approximate coordinates of measured positions of the alignment marks each of which is obtained with a sum of the measured shift amount and one of the designed positions corresponding thereto with respect to each of the at least two shot regions, by replacing the measured shift amount with the calculated feature values corresponding thereto; and
a console configured to display a variation of the coefficients calculated over a plurality of substrates with respect to each of the plurality of measurement conditions.

11. A method of manufacturing a device, said method comprising the steps of:
exposing a substrate to radiant energy using an exposure apparatus defined in claim 10;
developing the exposed substrate; and
processing the developed substrate to manufacture the device.

* * * * *